(12) United States Patent
Fang et al.

US010651311B2

(10) Patent No.: US 10,651,311 B2
(45) Date of Patent: May 12, 2020

(54) METAL GATE WITH SILICON SIDEWALL SPACERS

(71) Applicant: Taiwan Semiconductor Manufacturing Company, Ltd., Hsin-Chu (TW)

(72) Inventors: Wen-Han Fang, New Taipei (TW); Po-Chi Wu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/347,196

(22) Filed: Nov. 9, 2016

(65) Prior Publication Data

US 2017/0062617 A1   Mar. 2, 2017

Related U.S. Application Data

(62) Division of application No. 14/801,319, filed on Jul. 16, 2015, now Pat. No. 9,496,402.

(Continued)

(51) Int. Cl.
*H01L 29/78* (2006.01)
*H01L 29/66* (2006.01)
(Continued)

(52) U.S. Cl.
CPC .... *H01L 29/7856* (2013.01); *H01L 21/28185* (2013.01); *H01L 21/32137* (2013.01); *H01L 27/0886* (2013.01); *H01L 29/0649* (2013.01); *H01L 29/0653* (2013.01); *H01L 29/16* (2013.01); *H01L 29/401* (2013.01); *H01L 29/42372* (2013.01); *H01L 29/4966* (2013.01); *H01L 29/6656* (2013.01); *H01L 29/66545* (2013.01); *H01L 29/66795* (2013.01);
(Continued)

(58) Field of Classification Search
CPC ............. H01L 29/7853; H01L 29/7854; H01L 29/7856; H01L 29/4966; H01L 29/6656
See application file for complete search history.

(56) References Cited

U.S. PATENT DOCUMENTS 5,816,011 A   10/1998  Kuramoto
5,900,236 A    5/1999  Gerhardson et al.
(Continued)

FOREIGN PATENT DOCUMENTS

CN   1148791 A   4/1997
CN   1149651 A   5/1997
(Continued)

*Primary Examiner* — Amar Movva
(74) *Attorney, Agent, or Firm* — Slater Matsil, LLP

(57) ABSTRACT

A method includes forming an opening in a dielectric to reveal a protruding semiconductor fin, forming a gate dielectric on sidewalls and a top surface of the protruding semiconductor fin, and forming a conductive diffusion barrier layer over the gate dielectric. The conductive diffusion barrier layer extends into the opening. The method further includes forming a silicon layer over the conductive diffusion barrier layer and extending into the opening, and performing a dry etch on the silicon layer to remove horizontal portions and vertical portions of the silicon layer. After the dry etch, a conductive layer is formed over the conductive diffusion barrier layer and extending into the opening.

20 Claims, 18 Drawing Sheets

Related U.S. Application Data

(60) Provisional application No. 62/065,191, filed on Oct. 17, 2014.

(51) Int. Cl.

| | |
|---|---|
| *H01L 21/28* | (2006.01) |
| *H01L 29/40* | (2006.01) |
| *H01L 29/06* | (2006.01) |
| *H01L 29/49* | (2006.01) |
| *H01L 21/3213* | (2006.01) |
| *H01L 27/088* | (2006.01) |
| *H01L 29/16* | (2006.01) |
| *H01L 29/423* | (2006.01) |
| *H01L 21/02* | (2006.01) |
| *H01L 21/311* | (2006.01) |

(52) U.S. Cl.
CPC ...... *H01L 29/7851* (2013.01); *H01L 29/7853* (2013.01); *H01L 29/7854* (2013.01); *H01L 21/02071* (2013.01); *H01L 21/31111* (2013.01); *H01L 21/31116* (2013.01)

(56) References Cited

U.S. PATENT DOCUMENTS

| | | | |
|---|---|---|---|
| 7,015,534 B2* | 3/2006 | Colombo | H01L 21/28088 257/314 |
| 8,487,378 B2 | 7/2013 | Goto et al. | |
| 8,729,634 B2 | 5/2014 | Shen et al. | |
| 8,826,213 B1 | 9/2014 | Ho et al. | |
| 8,872,284 B2 | 10/2014 | Kelly et al. | |
| 8,887,106 B2 | 11/2014 | Ho et al. | |
| 2006/0286758 A1* | 12/2006 | Liang | H01L 21/823412 438/305 |
| 2013/0249019 A1* | 9/2013 | Kelly | H01L 29/7845 257/402 |
| 2014/0197457 A1 | 7/2014 | Wang et al. | |
| 2014/0282326 A1 | 9/2014 | Chen et al. | |

FOREIGN PATENT DOCUMENTS

| | | |
|---|---|---|
| CN | 102820269 A | 12/2012 |
| KR | 20130106751 A | 9/2013 |

\* cited by examiner

METAL GATE WITH SILICON SIDEWALL SPACERS

PRIORITY CLAIM AND CROSS-REFERENCE

This application is a divisional of U.S. patent application Ser. No. 14/801,319, entitled "Metal Gate with Silicon Sidewall Spacers," filed on Jul. 16, 2015, which application claims the benefit of the following provisionally filed U.S. Patent Application No. 62/065,191, filed Oct. 17, 2014, and entitled "Method of Forming a Gate Electrode for Transistor;" which applications are hereby incorporated herein by reference.

BACKGROUND

Metal-Oxide-Semiconductor (MOS) devices are basic building elements in integrated circuits. An existing MOS device typically has a gate electrode comprising polysilicon doped with p-type or n-type impurities, using doping operations such as ion implantation or thermal diffusion. The work function of the gate electrode may be adjusted to the band-edge of the silicon. For an n-type Metal-Oxide-Semiconductor (NMOS) device, the work function may be adjusted to close to the conduction band of silicon. For a P-type Metal-Oxide-Semiconductor (PMOS) device, the work function may be adjusted to close to the valence band of silicon. Adjusting the work function of the polysilicon gate electrode can be achieved by selecting appropriate impurities.

MOS devices with polysilicon gate electrodes exhibit carrier depletion effect, which is also known as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes, wherein the metallic gates used in NMOS devices and PMOS devices may also have band-edge work functions. Accordingly, the resulting metal gates include a plurality of layers to suit to the requirements of the NMOS devices and PMOS devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 15A illustrate the cross-sectional views of intermediate stages in the formation of a Fin Field-Effect Transistor (FinFET) in accordance with some embodiments;

DETAILED DESCRIPTION

Figure 1:
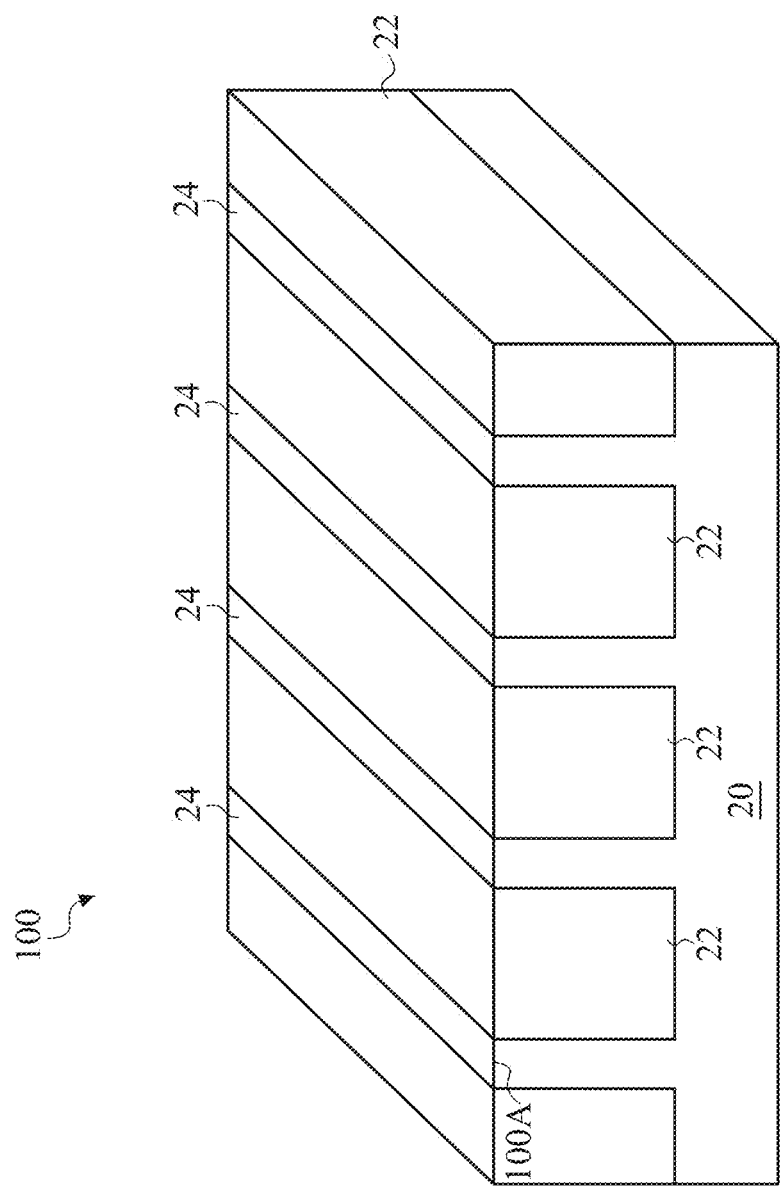

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Fin Field-Effect Transistor (FinFET) and the method of forming the same are provided in accordance with various exemplary embodiments. The intermediate stages of forming the FinFET are illustrated. The variations of the embodiments are discussed. Throughout the various views and illustrative embodiments, like reference numbers are used to designate like elements.

Figure 17:
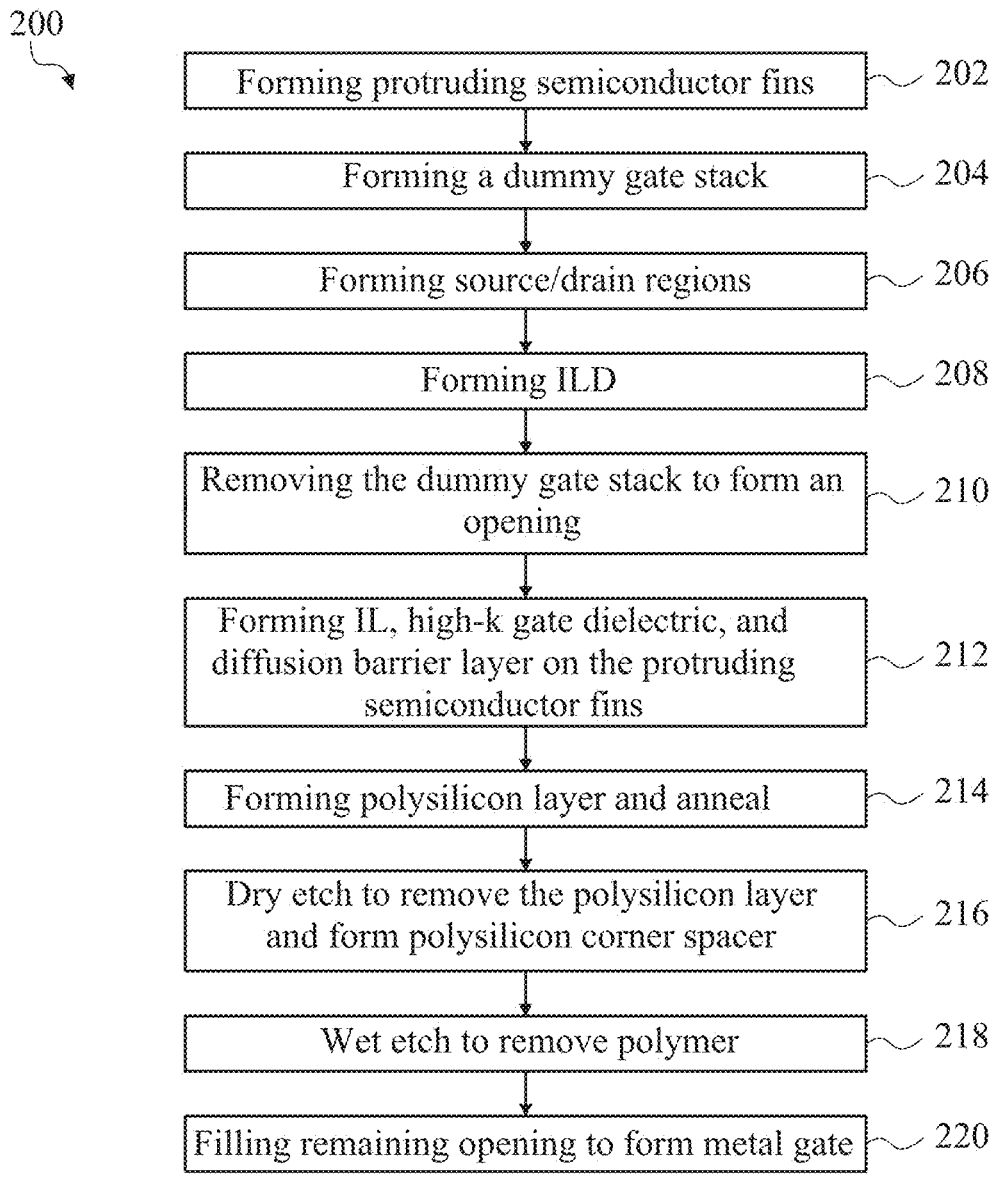
FIG. 17 illustrates a flow chart for forming a FinFET in accordance with some embodiments.

FIGS. 1 through 15A illustrate the cross-sectional views of intermediate stages in the formation of a FinFET in accordance with some embodiments. The steps shown in FIGS. 1 through 15A are also illustrated schematically in the process flow 200 as shown in FIG. 17. In the subsequent discussion, the process steps shown in FIGS. 1 through 15A are discussed referring to the process steps in FIG. 17.

FIG. 1 illustrates a perspective view of an initial structure. The initial structure includes wafer 100, which further includes substrate 20. Substrate 20 may be a semiconductor substrate, which may further be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20, wherein the top surface of substrate 20 is a major surface 100A of wafer 100. The portions of substrate 20 between neighboring STI regions 22 are referred to as semiconductor fins 24. The top surfaces of semiconductor fins 24 and the top surfaces of STI regions 22 may be substantially level with each other.

STI regions 22 may include silicon oxide, which may be formed using, for example, High-Density Plasma (HDP) Chemical Vapor Deposition (CVD). STI regions 22 may also include an oxide formed of Flowable Chemical Vapor Deposition (FCVD), spin-on, or the like.

Figure 2:
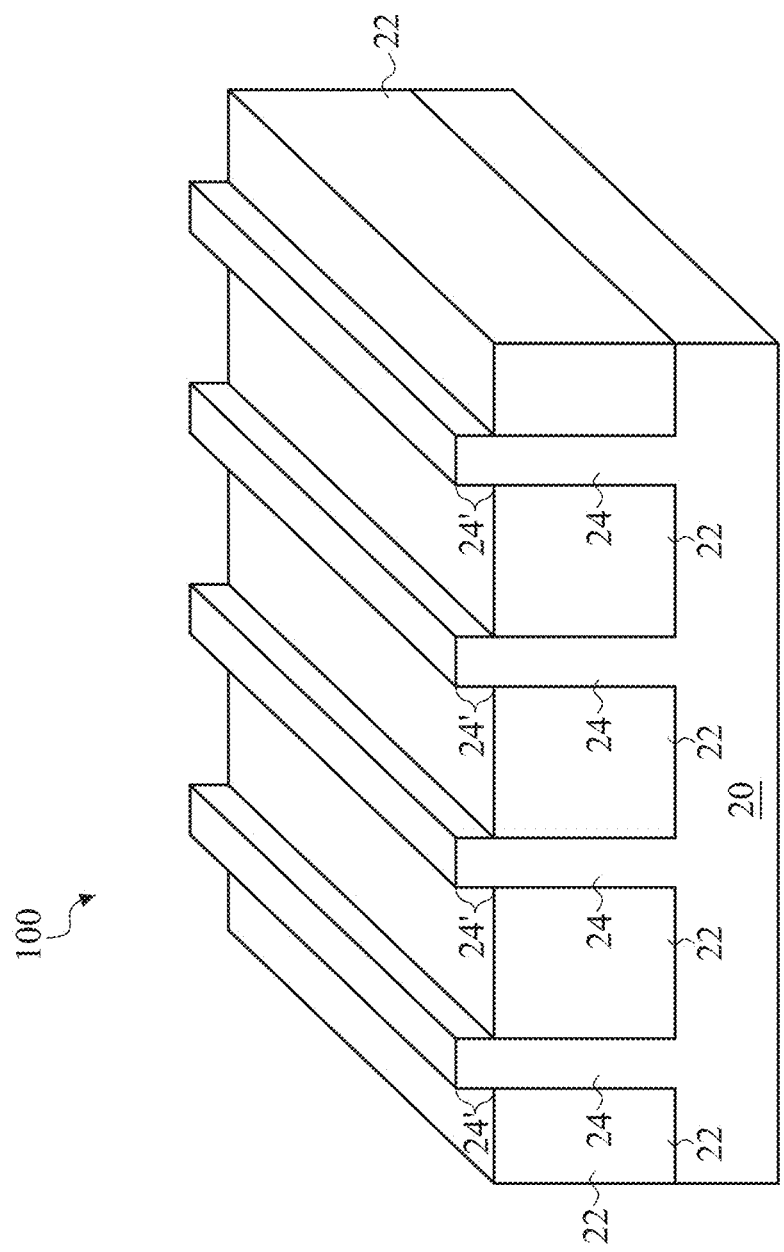

Referring to FIG. 2, STI regions 22 are recessed, so that top portions of semiconductor fins 24 are higher than the top surfaces of STI regions 22 to form protruding fins 24'. The respective step is shown as step 202 in the process flow 200 as shown in FIG. 17. The etching may be performed using a dry etching process, wherein HF and NH3 are used as the etching gases. In alternative embodiments, the etching gases include NF3 and NH3. During the etching process, plasma may be generated. In an exemplary etching process, the etching gases have a pressure in the range between about 100 mtorr and about 200 mtorr. The flow rate of HF may be in the range between about 50 sccm and about 150 sccm. The flow rate of NH3 may be in the range between about 50 sccm and about 150 sccm. Argon may also be included, with a flow rate of argon in the range between about 20 sccm and about 100 sccm. In alternative embodiments, the recessing of STI regions 22 is performed using a wet etch process. The etching chemical may include diluted HF, for example.

Figure 3:
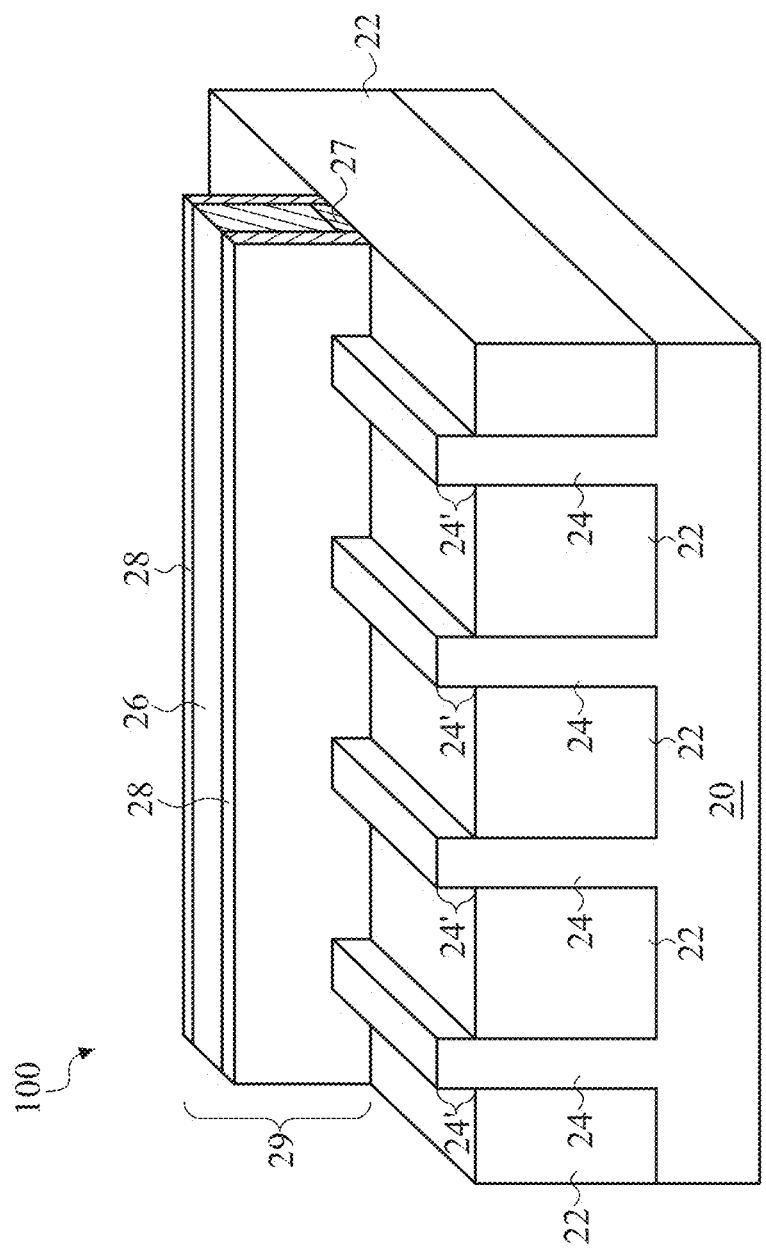

Referring to FIG. 3, gate stack 29 is formed on the top surface and the sidewalls of protruding fins 24'. The respective step is shown as step 204 in the process flow 200 as shown in FIG. 17. Gate stack 29 includes gate dielectric 27, and gate electrode 26 over gate dielectric 27. Gate electrode 26 may be formed, for example, using polysilicon, although other materials may also be used. Gate stack 29 may also comprise a hard mask layer (not shown) over gate electrode 26, wherein the hard mask layer may be formed silicon oxide, for example. Gate stack 29 may cross over a single one or a plurality of protruding fins 24' and/or STI regions 22. Gate stack 29 may also have a lengthwise direction substantially perpendicular to the lengthwise direction of protruding fins 24'. In accordance with some embodiments of the present disclosure, gate stack 29 is a dummy gate stack, and will be replaced by a replacement gate in a subsequent step.

Next, gate spacers 28 are formed on the sidewalls of gate stack 29. In accordance with some embodiments of the present disclosure, gate spacers 28 are formed of a dielectric material such as silicon carbonitride (SiCN), silicon nitride, or the like, and may have a single-layer structure or a multi-layer structure. Gate spacers 28 may also have a composite structure including a plurality of dielectric layers.

Figure 4:
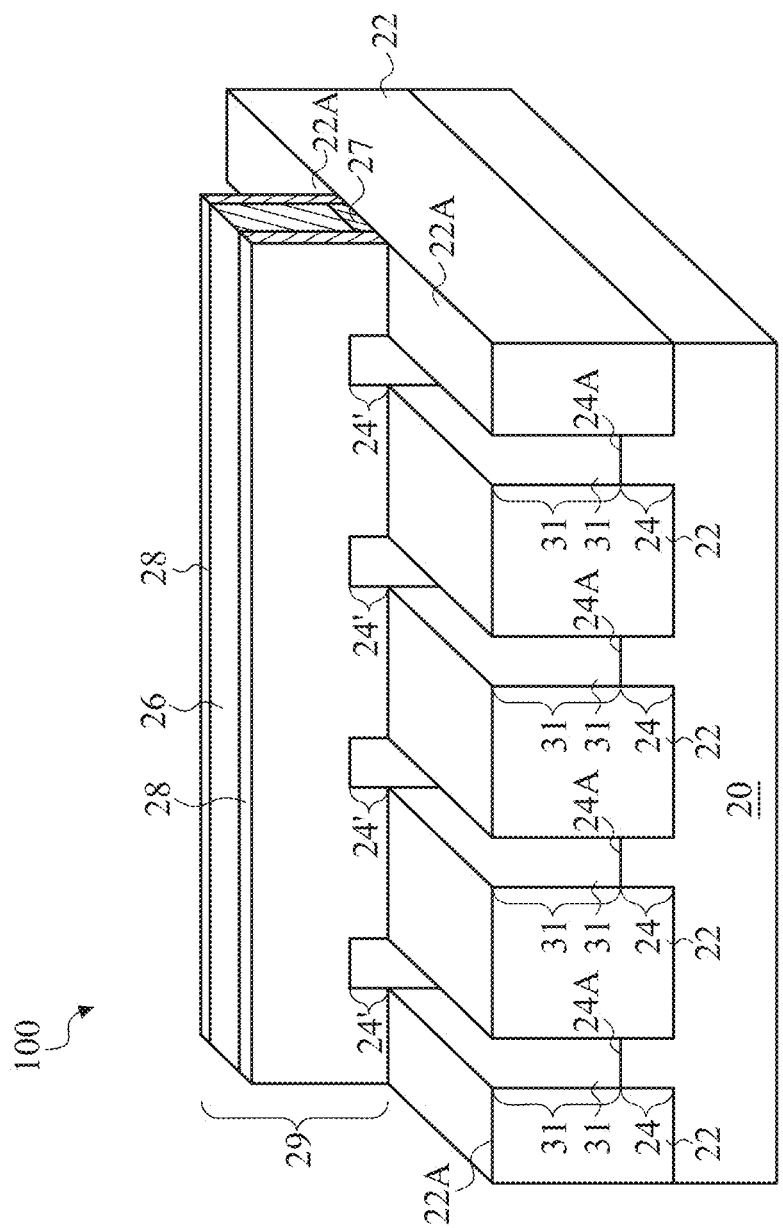

An etching step (referred to as source/drain recessing hereinafter) is then performed to etch the portions of protruding fins 24' that are not covered by gate stack 29 and gate spacers 28, resulting in the structure shown in FIG. 4. The recessing may be anisotropic, and hence the portions of semiconductor fins 24 directly underlying gate stack 29 and gate spacers 28 are protected, and are not etched. The top surfaces 24A of the recessed semiconductor fins 24 are lower than the top surfaces 22A of STI regions 22. Recesses 31 are accordingly formed between STI regions 22. Recesses 31 are located on opposite sides of gate stack 29.

Figure 5:
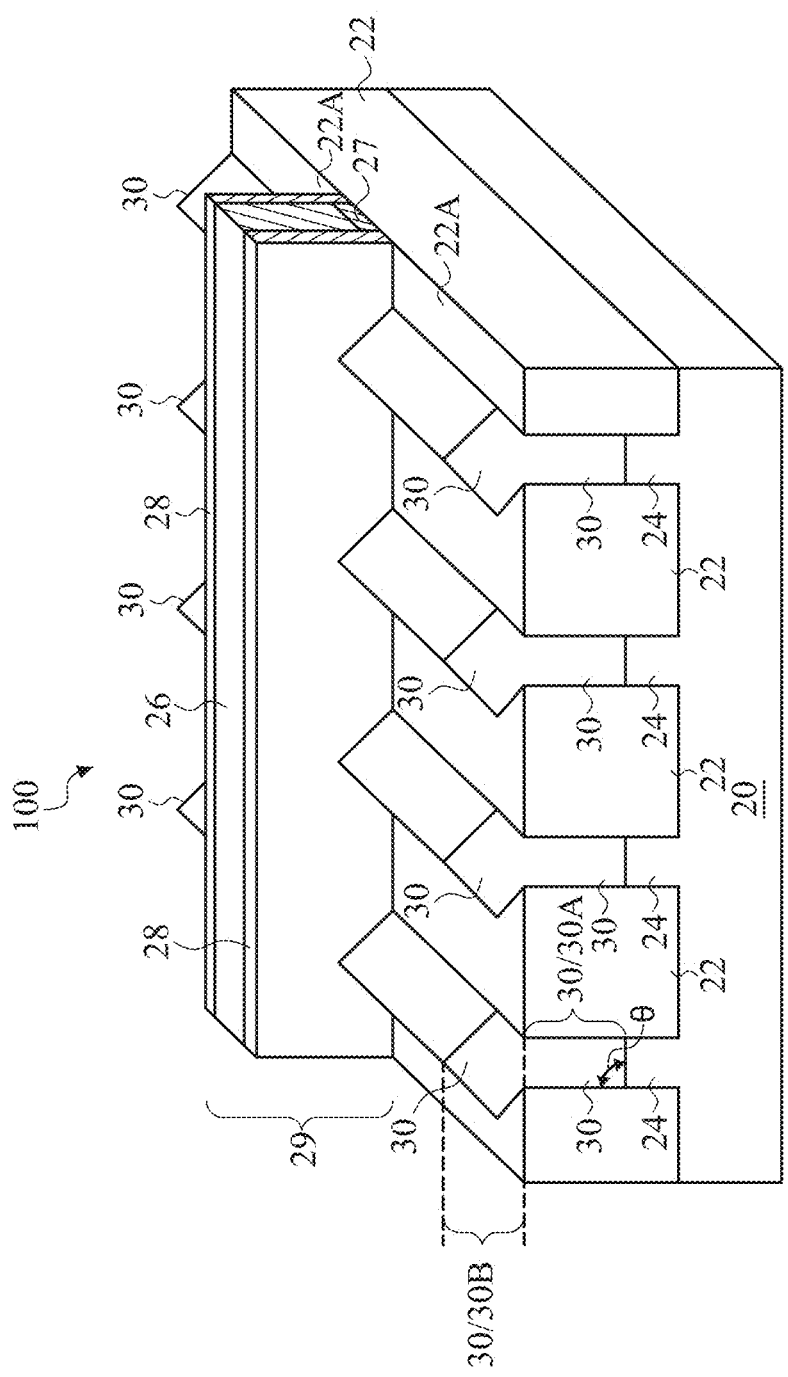

Next, epitaxy regions 30 are formed by selectively growing a semiconductor material in recesses 31, resulting in the structure in FIG. 5. The steps shown in FIGS. 4 and 5 are shown as step 206 in the process flow 200 as shown in FIG. 17. In some exemplary embodiments, epitaxy regions 30 comprise silicon germanium or silicon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, SiGeB may be grown. Conversely, when the resulting FinFET is an n-type FinFET, SiP may be grown. In alternative embodiments, epitaxy regions 30 comprise III-V compound semiconductors such as GaAs, InP, GaN, InGaAs, InAlAs, GaSb, AlSb, AlAs, AlP, GaP, combinations thereof, or multi-layers thereof. After recesses 31 are filled with epitaxy regions 30, the further epitaxial growth of epitaxy regions 30 causes epitaxy regions 30 to expand horizontally, and facets may start to form. Furthermore, some of top surfaces 22A of STI regions 22 are underlying and aligned to some portions of epitaxy regions 30 due to the lateral growth of epitaxy regions 30.

After the epitaxy step, epitaxy regions 30 may be further implanted with a p-type or an n-type impurity to form source and drain regions, which are also denoted using reference numeral 30. In alternative embodiments, the implantation step is skipped since source and drain regions are formed during the epitaxy due to the in-situ doping of the p-type or n-type impurity. Source and drain regions 30 are on opposite sides of gate stack 29, and may be overlying and overlapping portions of surfaces 22A of STI regions 22. Epitaxy regions 30 include lower portions 30A that are formed in STI regions 22, and upper portions 30B that are formed over the top surfaces 22A of STI regions 22. Lower portions 30A, whose sidewalls are shaped by the shapes of recesses 31 (FIG. 4), may have (substantially) straight edges, which may also be vertical edges that are perpendicular to the major surfaces (such as bottom surface 20B) of substrate 20. For example, the tilt angle θ of the sidewalls of lower portions 30A may be in the range between about 80 degrees and about 90 degrees.

Figure 6:
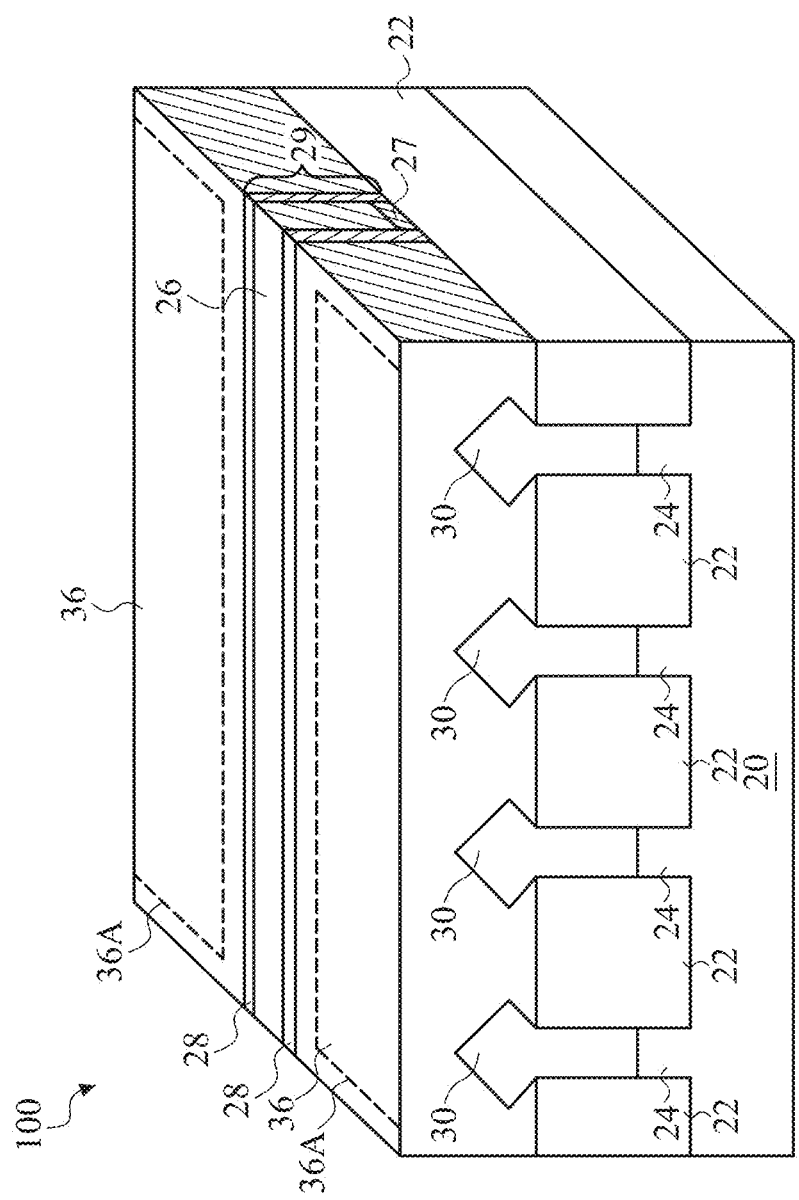
Figure 7:
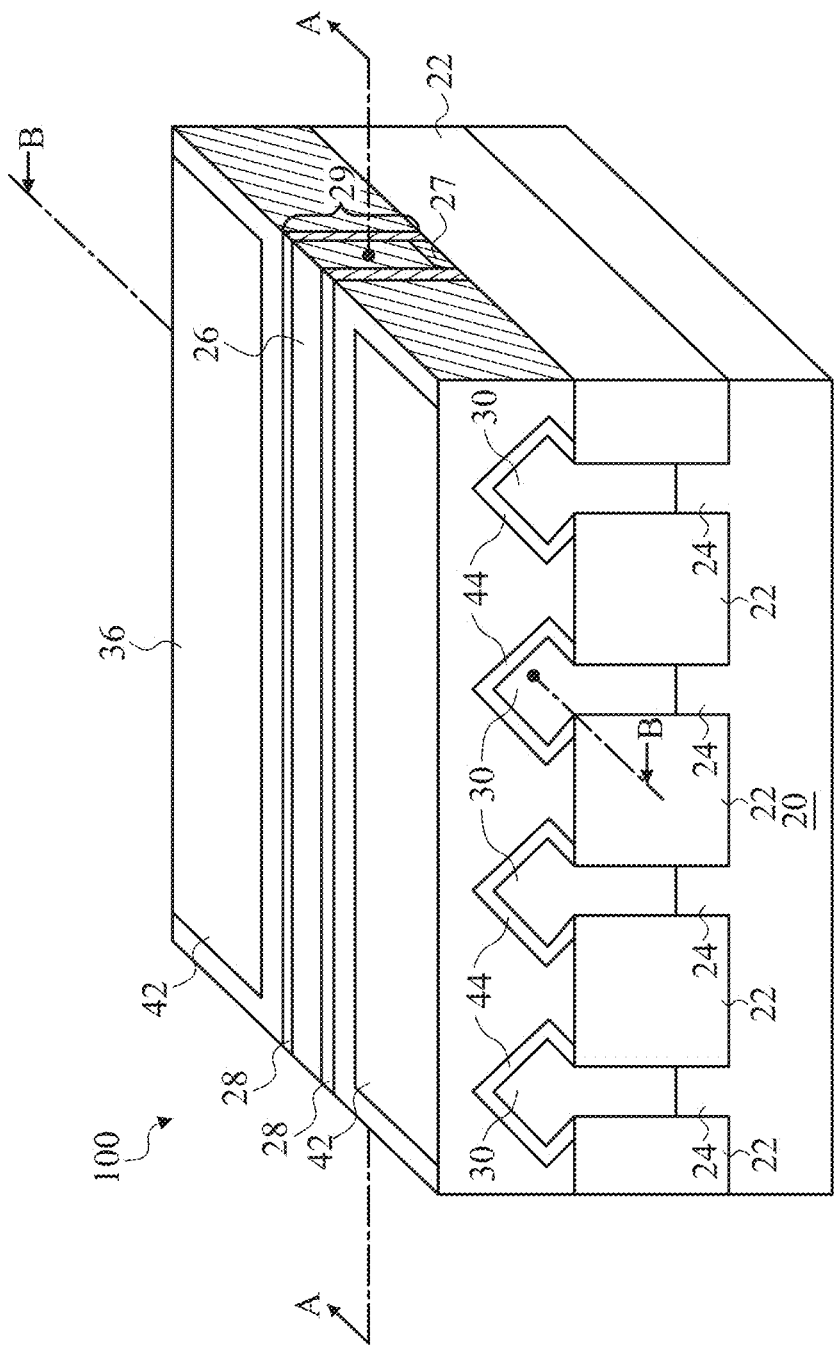

FIG. 6 illustrates a perspective view of the structure after Inter-Layer Dielectric (ILD) 36 is formed. The respective step is shown as step 208 in the process flow 200 as shown in FIG. 17. In accordance with some embodiments of the present disclosure, a buffer oxide layer (not shown) and a Contact Etch Stop Layer (CESL, not shown) are formed on source and drain regions 30 before the formation of ILD 36. In accordance with some embodiments of the present disclosure, the buffer oxide layer comprises silicon oxide, and the CESL may comprise silicon nitride, silicon carbonitride, or the like. The buffer oxide layer and the CESL may be formed using Atomic Layer Deposition (ALD), for example. ILD 36 may comprise Flowable oxide formed using, for example, Flowable Chemical Vapor Deposition (FCVD). ILD 36 may also include Phospho-Silicate glass (PSG), Boro-Silicate Glass (BSG), Boron-Doped Phospho-Silicate Glass (BPSG), Tetra Ethyl Ortho Silicate (TEOS) oxide, or the like. A Chemical Mechanical Polish (CMP) may be performed to level the top surfaces of ILD 36, gate stack 29, and gate spacers 28 with each other.

In a subsequent step, portions 36A of ILD 36 are removed to form contact openings. Source/drain silicide regions 44 (FIG. 7) are then formed on the surfaces of epitaxy regions 30. The formation process includes depositing a metal layer into the contact openings, performing an anneal to react the metal layer with the exposed surface portions of epitaxy regions 30 to form silicide regions 44, and then removing the unreacted metal in the metal layer. A conductive material such as tungsten is then filled into the contact openings to form contact plugs 42.

Next, the dummy gate stack including dummy gate electrode 26 and dummy gate dielectric 27 are replaced with a metal gate and a replacement gate dielectric, as shown in FIGS. 8 through 15A. The cross-sectional views shown in FIGS. 8 through 15A are obtained from the same vertical plane containing line A-A in FIG. 7.

Figure 8:
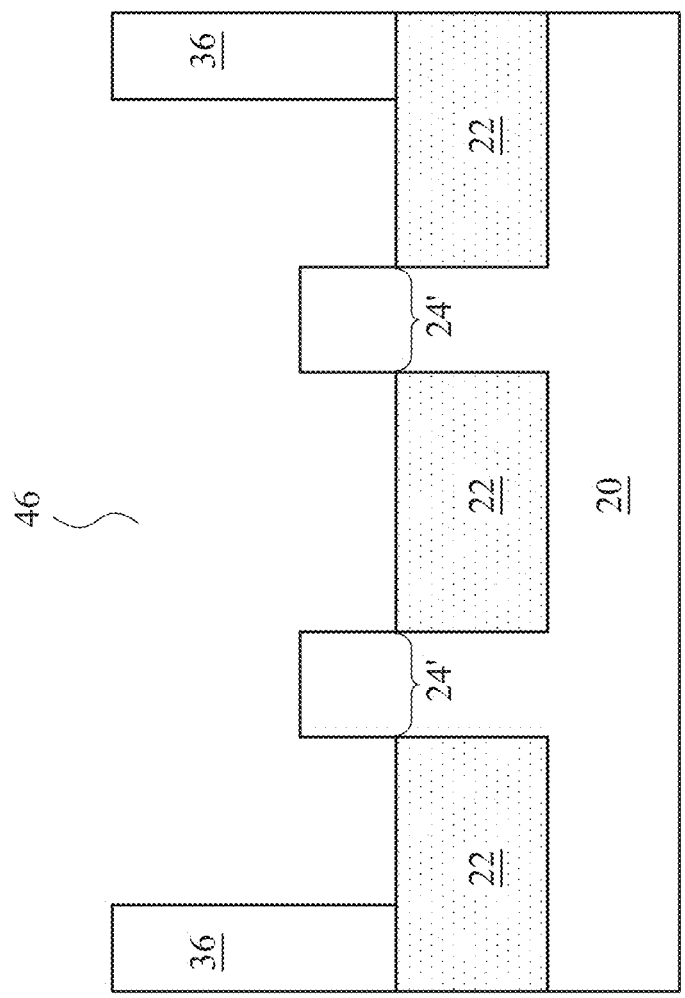

First, dummy gate electrode 26 and dummy gate dielectric 27 are removed, forming opening 46, as shown in FIG. 8. The respective step is shown as step 210 in the process flow 200 as shown in FIG. 17. The top surfaces and the sidewalls of protruding fins 24' are exposed to opening 46.

Figure 9:
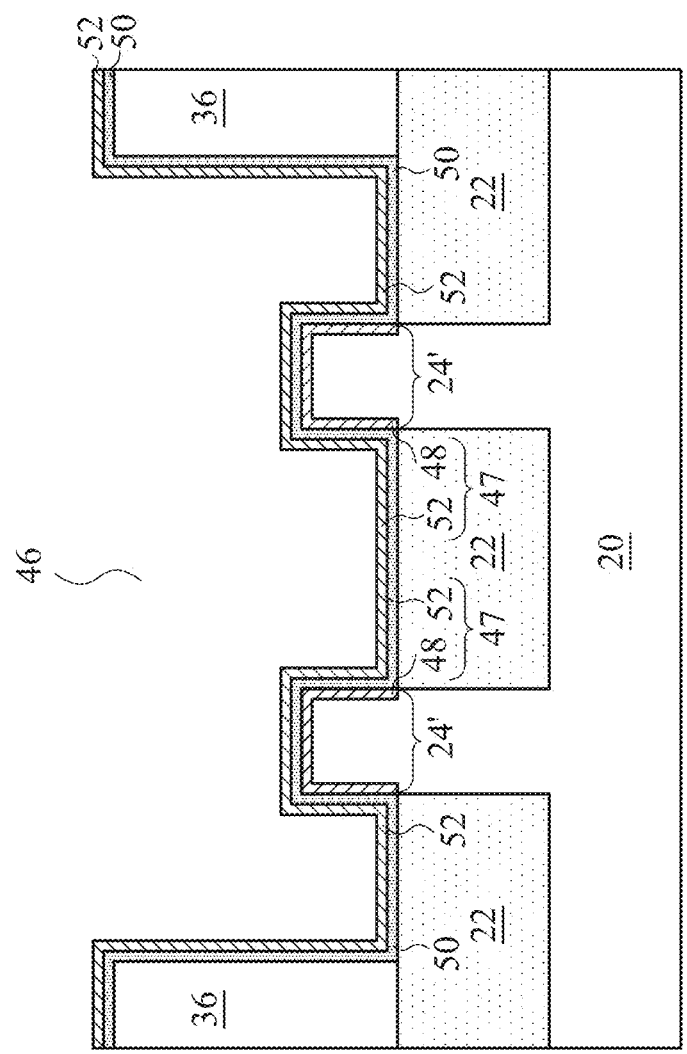

Next, referring to FIG. 9, gate dielectric 47 is formed. In accordance with some embodiments of the present disclosure, gate dielectric 47 includes Interfacial Layer (IL) 48 as a lower part. IL 48 is formed on the exposed surfaces of protruding fins 24'. IL 48 may include an oxide layer such as a silicon oxide layer, which is formed through the thermal oxidation of protruding fins 24', a chemical oxidation process, or a deposition process. Gate dielectric 47 may also include high-k dielectric layer 50 formed over IL 48. High-k dielectric layer 50 includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0, and sometimes as high as 21.0 or higher. The high-k dielectric layer is overlying, and may contact, IL 48. High-k dielectric layer 50 is formed as a conformal layer, and extends on the sidewalls of protruding fins 24' and the top surface and the sidewalls of ILD 36.

Referring again to FIG. 9, conductive diffusion barrier layer 52 is formed over gate dielectric layer 47. In accordance with some embodiments of the present disclosure, diffusion barrier layer 52 includes TiN. The TiN layer may have a thickness smaller than about 60 Å, and may be in the range between about 10 Å and about 20 Å. Optionally, a TaN layer (the upper part of diffusion barrier layer 52) may be formed over the TiN layer. The TaN layer may have a thickness lower than about 20 Å in accordance with some embodiments. Diffusion barrier layer 52 includes bottom portions (which are horizontal portions) at the bottoms of opening 46, and sidewall portions (which are vertical portions) in contact with the high-k dielectric layer 50. The steps shown in FIG. 9 are shown as step 212 in the process flow 200 as shown in FIG. 17.

Next, a treatment is performed to improve the ability of conductive diffusion barrier layer 52 in the blocking of oxygen penetration during subsequent processing steps. In some embodiments, the treatment includes a decoupled plasma nitridation (DPN) process followed by an anneal process. The DPN may be performed using a nitrogen-containing process gas, such as N2, NH3, or the like. The anneal may be performed, for example, at a temperature of about 800° C. to about 1,000° C. for about 1 millisecond to about 50 seconds. Through the treatment, the nitrogen concentration in conductive diffusion barrier layer 52 along the interface between conductive diffusion barrier layer 52 and the gate dielectric layer 47 is increased.

Figure 10:
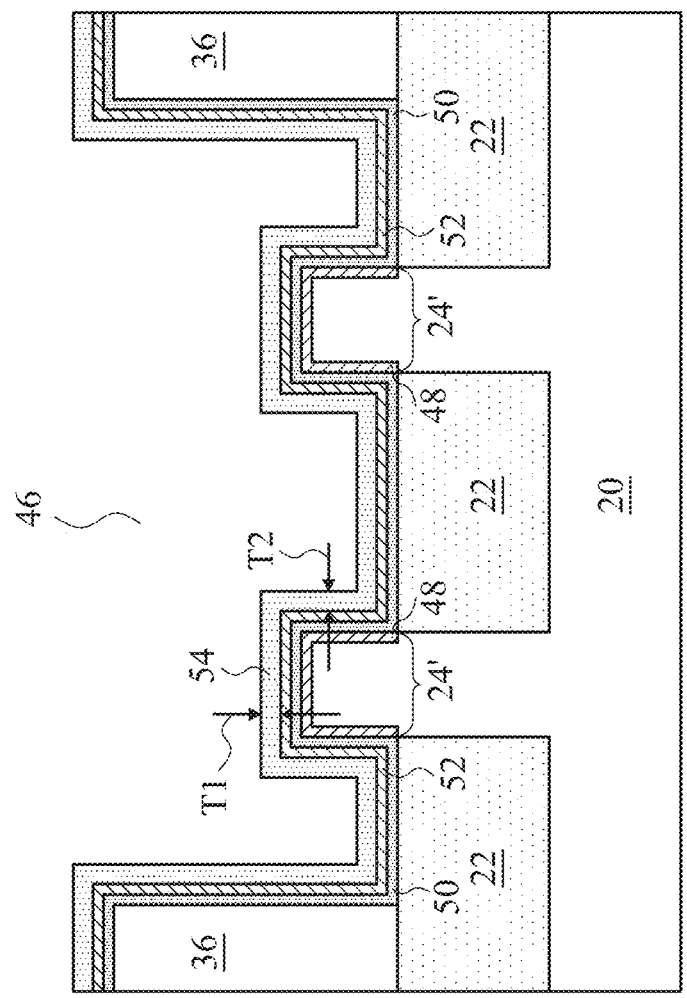

Next, as shown in FIG. 10, polysilicon capping layer 54 is deposited over diffusion barrier layer 52. The respective step is shown as step 214 in the process flow 200 as shown in FIG. 17. Throughout the description, although capping layer 54 is referred to as a polysilicon capping layer, it may also comprise amorphous silicon in accordance with other embodiments. Polysilicon capping layer 54 may be deposited using Chemical Vapor Deposition (CVD), and is formed as a conformal layer, whose thickness T1 of the horizontal portions is close to thickness T2 of the vertical portions. For example, the thickness difference |T1−T2| may be smaller than about 20 percent of either one of the thicknesses T1 and T2. Thicknesses T1 and T2 may be in the range between about 40 Å and about 80 Å. In accordance with some embodiments of the present disclosure, polysilicon capping layer 54 is not doped with p-type and n-type impurities such as boron, indium, phosphorous, arsenic, and antimony.

Polysilicon capping layer 54 is formed as a sacrificial layer, and is used to protect diffusion barrier layer 52 and high-k dielectric layer 50 during the subsequent post-capping anneal. Accordingly, during the entirety of the subsequent post-capping anneal, polysilicon capping layer 54 resides over diffusion barrier layer 52. In accordance with some embodiments, the post-capping anneal is performed at a temperature in the range between about 350° C. and about 750° C. The anneal may be performed for a period of time in the range between about 20 seconds and about 60 seconds. The post-capping anneal may be performed using furnace anneal, laser anneal, RTA, or the like.

Figure 11:
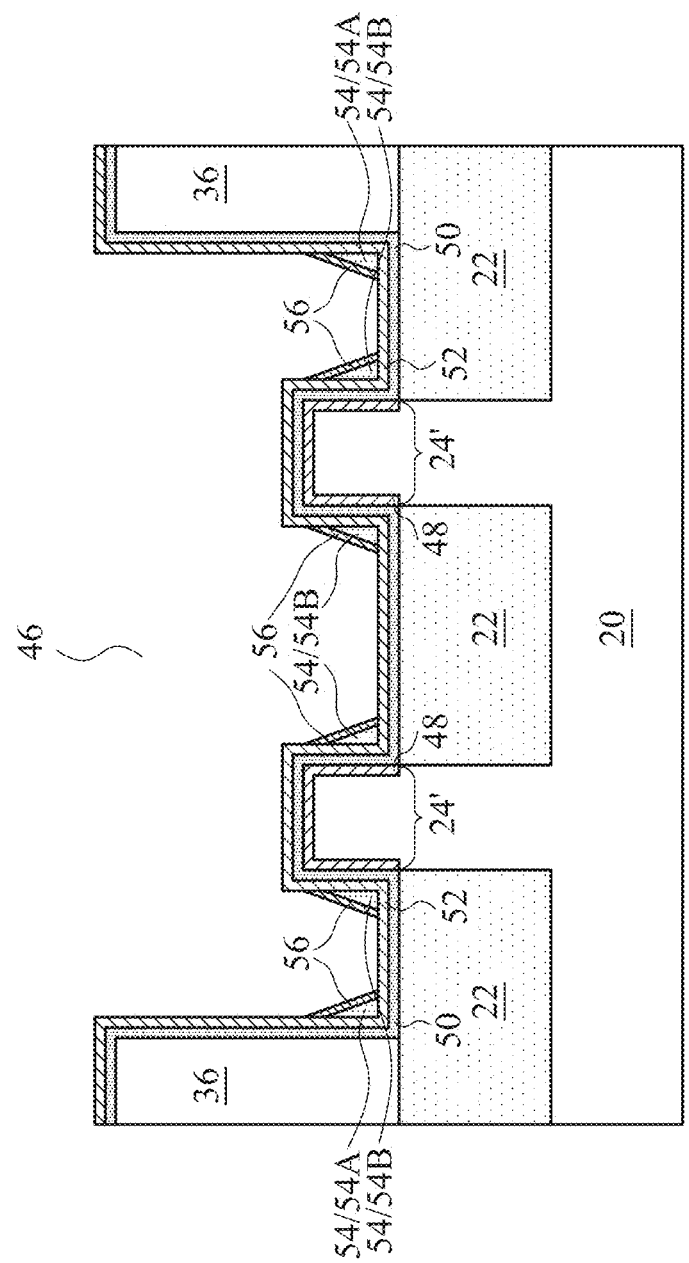

After the post-capping anneal, an anisotropic etch is performed to remove polysilicon capping layer 54, and the resulting structure is shown in FIG. 11. In accordance with some embodiments, the anisotropic etch is performed using a dry etch process. The respective step is shown as step 216 in the process flow 200 as shown in FIG. 17. In the anisotropic etch, plasma is turned on. In accordance with some embodiments of the present disclosure, the process gas includes HBr and NF3 as etching gases for removing polysilicon. In addition, the process gas includes a deposition gas used for depositing polymer 56 at the bottom corners of opening 46. In accordance with some exemplary embodiments, the deposition gas includes a carbon-and-hydrogen containing gas such as CH4, wherein the carbon-and-hydrogen containing gas is used to generate carbon-containing polymer 56. Argon may also be added in the process gas. Polymer 56 is deposited to the bottom corners of opening 46, while in other parts such as the majority of the sidewalls and bottom surfaces of diffusion barrier layer 52, less or substantially no polymer 56 is deposited. Polymer 56 protects the corner portions of polysilicon layer 54 from being etched in the anisotropic etch. Accordingly, some corner portions 54A and 54B of polysilicon layer 54 are left unremoved after the anisotropic etching, and are referred to as polysilicon corner spacers 54 (including 54A and 54B) hereinafter. Polysilicon corner spacers 54A are on the sidewalls of ILD 36, and polysilicon spacers 54B are on the sidewalls of protruding fins 24'. Corner spacers 54A and 54B may also include amorphous silicon in accordance with some embodiments.

In the above-discussed process for removing polysilicon layer 54, the dry etch process is adopted. Although wet etch is also capable of removing polysilicon capping layer 54, the wet etch is isotropic. Furthermore, the wet etch has high etching rates in some lattice direction of polysilicon. As a result, if the wet etch is used to remove polysilicon capping layer 54, the corner portions of polysilicon will be fully removed, exposing the corner portions of diffusion barrier layer 52 and high-k dielectric layer 50. As a result, the corner portions of diffusion barrier layer 52 and high-k dielectric layer 50 may be etched, and hence exposing the adjacent protruding fins 24'. This may cause the subsequently filled gate metal (such as tungsten or cobalt) to form extrusions toward protruding fins 24', and the resulting gate may potentially be shorted to protruding fins 24'. In the embodiments of the present disclosure, by using the anisotropic etch and further adding a deposition gas, the undesirable formation of extrusions is avoided.

Figure 12:
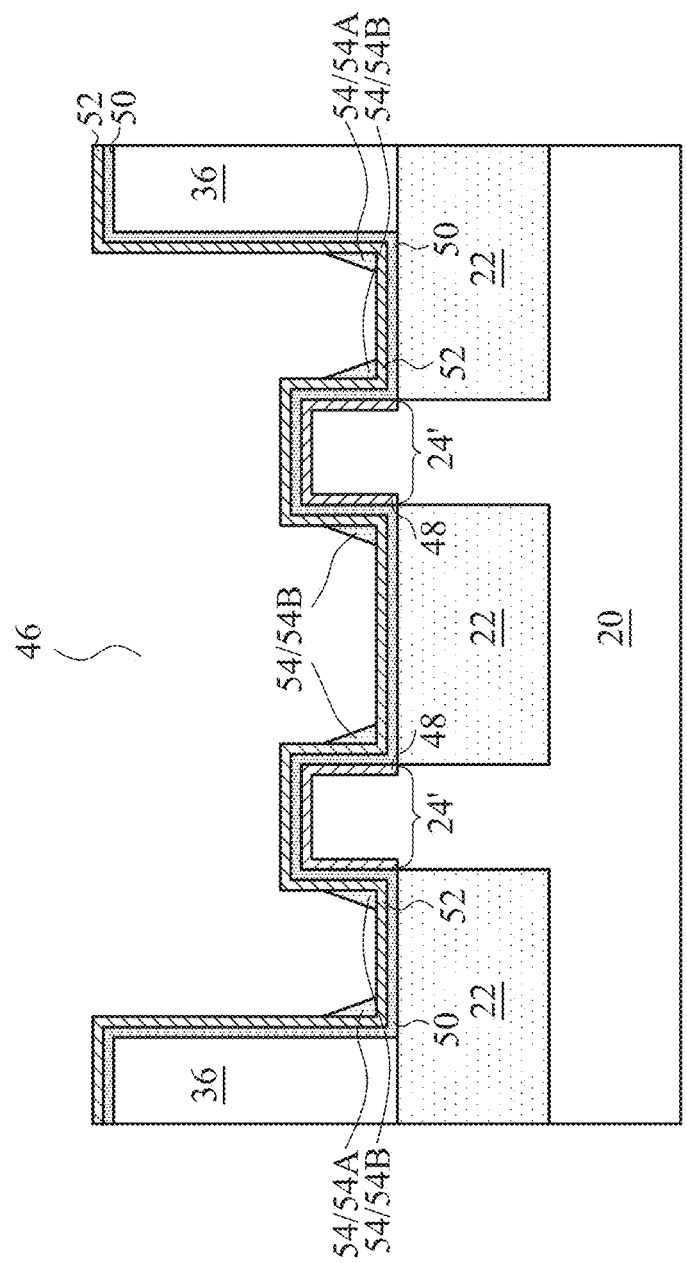

FIG. 12 illustrates the removal of polymer 56, which is performed using a wet etch. The respective step is shown as step 218 in the process flow 200 as shown in FIG. 17. The etchant is selected so that in the wet etch, polymer 56 is removed, and polysilicon corner spacers 54A and 54B and diffusion barrier layer 52 are not etched. In accordance with some embodiments of the present disclosure, the wet etch is performed using a chemical comprising HF and NH3.

Figure 13:
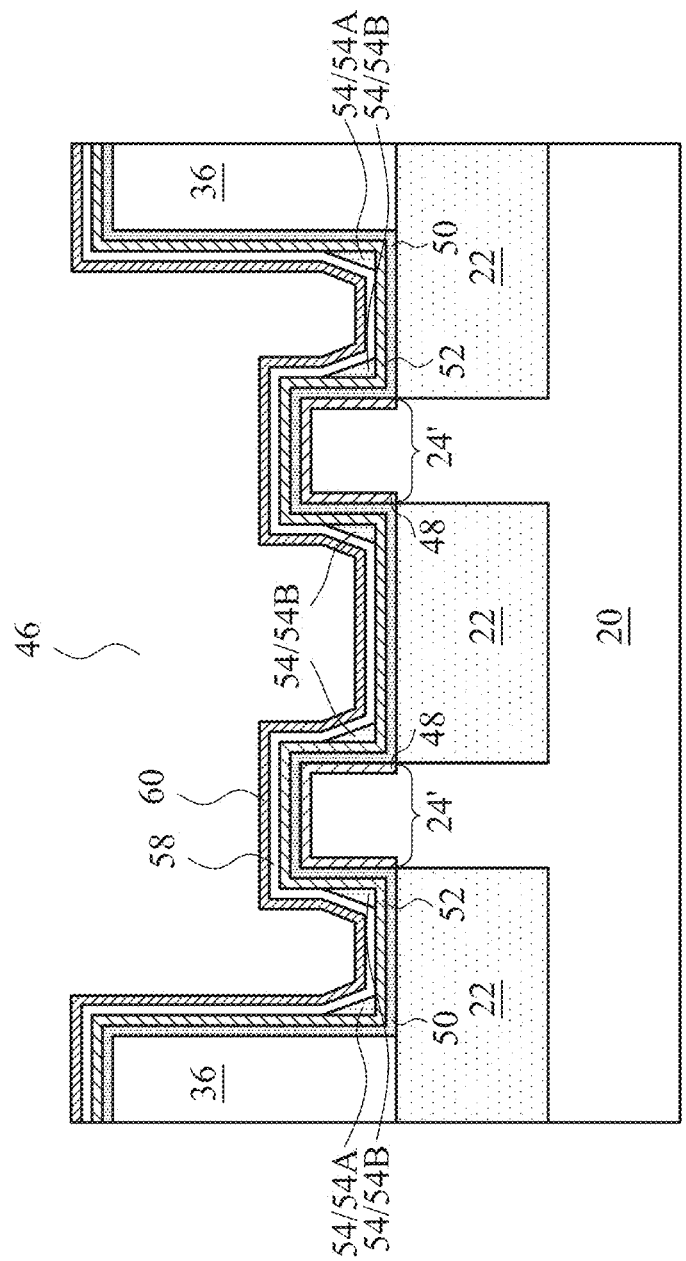

FIGS. 13 through 15A illustrate the remaining formation steps for forming the metal gate. The respective step is shown as step 220 in the process flow 200 as shown in FIG. 17. FIG. 13 illustrates the formation of an additional conductive layer 58 over silicon corner spacers 54A and 54B and diffusion barrier layer 52. Conductive layer 58 includes some portions in contact with polysilicon corner spacers 54A and 54B, and other portions in contact with diffusion barrier layer 52. Also, polysilicon corner spacers 54A and 54B separate the corner portions of diffusion barrier layer 52 from conductive layer 58. Furthermore, diffusion barrier layer 52 and conductive layer 58 in combination forming an envelope fully enclosing (and sealing) polysilicon corner spacers 54A and 54B therein. In accordance with some embodiments of the present disclosure, conductive layer 58 comprises TaN, which may also act as a diffusion barrier layer. In alternative embodiments, other materials such as TiAl, TiN, Co, Al, or the like, may be used to form conductive layer 58.

FIG. 13 also illustrates the formation of conductive layer 60, which is sometimes referred to as a work function metal since it sets the work function for the resulting FinFET. In the embodiments in which the resulting FinFET is an n-type FinFET, conductive layer 60 may be a TiAl layer. In alternative embodiments in which the resulting FinFET is a p-type FinFET, conductive layer 60 may be a TiN layer, wherein a TiAl layer may be formed over the TiN layer. The formation methods may include Physical Vapor Deposition (PVD), for example.

Figure 14:
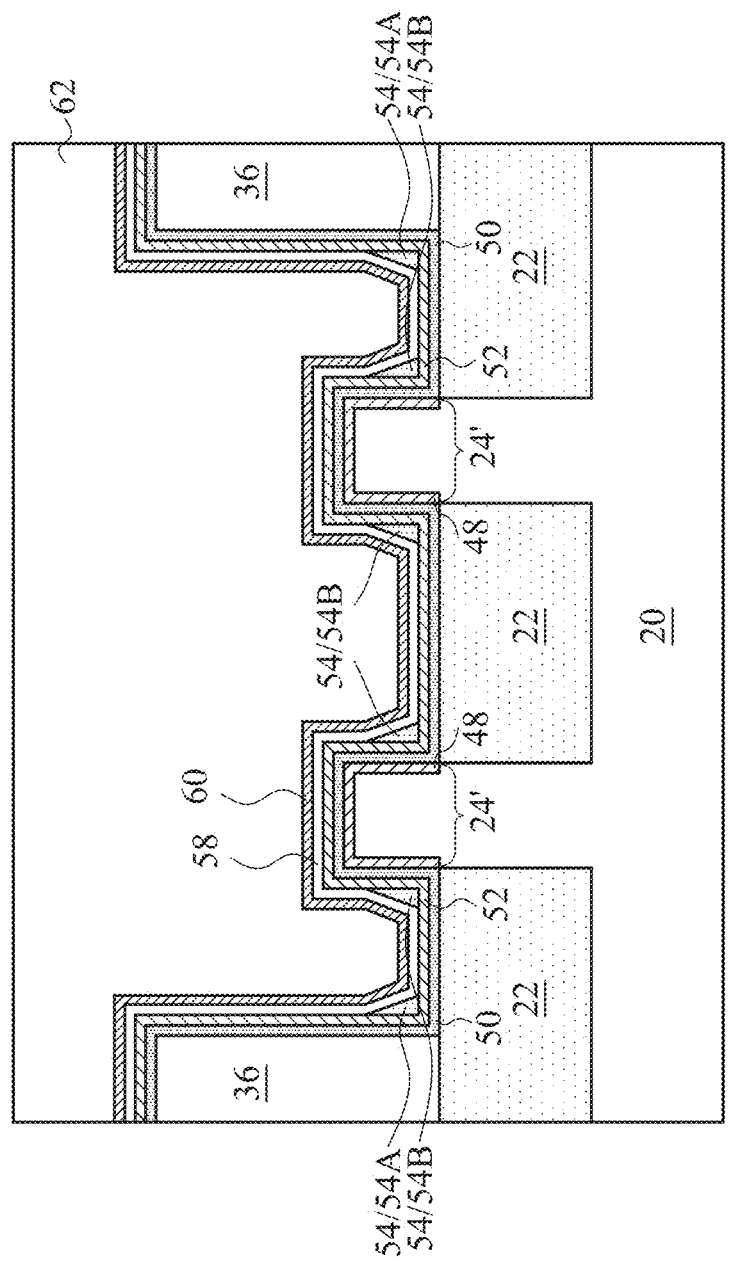

Next, layers 62 are formed to fill recess 46, and the resulting structure is shown in FIG. 14. In accordance with some exemplary embodiments, the subsequently formed metal layers 62 include a block layer, a wetting layer, and a filling metal. The block layer may comprise TiN in some embodiments, which may be formed using PVD. The wetting layer may be a cobalt layer, which may be formed using CVD. The filling metal may comprise aluminum or an aluminum alloy, which may also be formed using PVD, CVD, or the like. The filling metal may be reflowed to fully fill the remaining recess 46 as in FIG. 13.

Figure 15A:
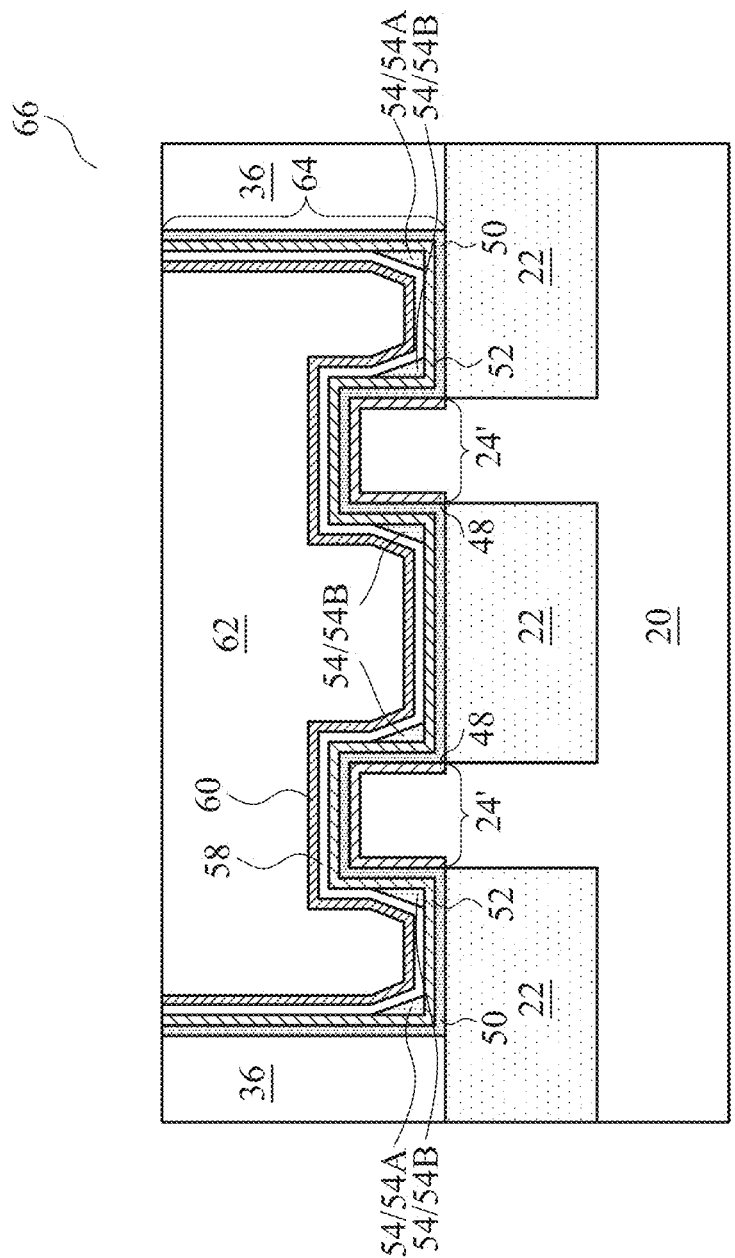

FIG. 15A illustrates a planarization step (for example, a CMP) for removing the excess portions of layers 50, 52, 56, 58, 60, and 62 over ILD 36. The remaining portions of layers 48, 50, 52, 56, 58, 60, and 62 and polysilicon corner spacers 54A and 54B in combination form replacement gate stack 64. Each of the remaining portions of layers 50, 52, 56, 58, 60 includes a bottom portion, and sidewall portions over and connected to the bottom portion. FinFET 66 is thus formed.

In the illustrated embodiments, source/drain contact plugs 42 are formed before the formation of replacement gate 64. In accordance with alternative embodiments of the present disclosure, source/drain contact plugs 42 may also be formed after the formation of replacement gate 64.

Figure 15B:
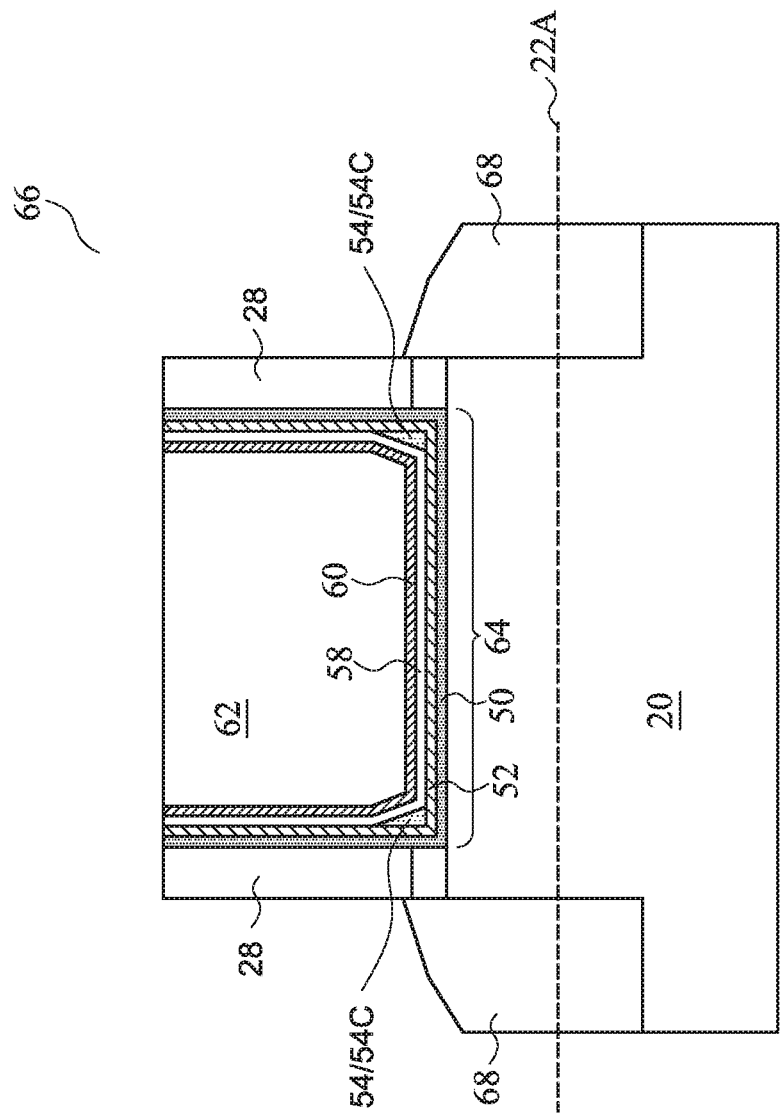
FIG. 15B illustrates another cross-sectional view of a FinFET in accordance with some embodiments, wherein the cross-sectional view is obtained from a channel-length direction of the FinFET.

FIG. 15A illustrates the cross-sectional view obtained from the plane perpendicular to the lengthwise directions of protruding fins 24'. For example, FIG. 15A illustrates the cross-sectional view obtained from the vertical planes containing line A-A in FIG. 7 (except the dummy gate shown in FIG. 7 has being replaced by the replacement gate). FIG. 15B illustrates the cross-sectional view obtained from the plane parallel to the lengthwise directions of protruding fins 24', wherein the plane is the same plane containing line B-B in FIG. 7. FIG. 15B illustrates that polysilicon corner spacers 54C may also be formed on the opposite ends close to source/drain regions 68.

Figure 16:
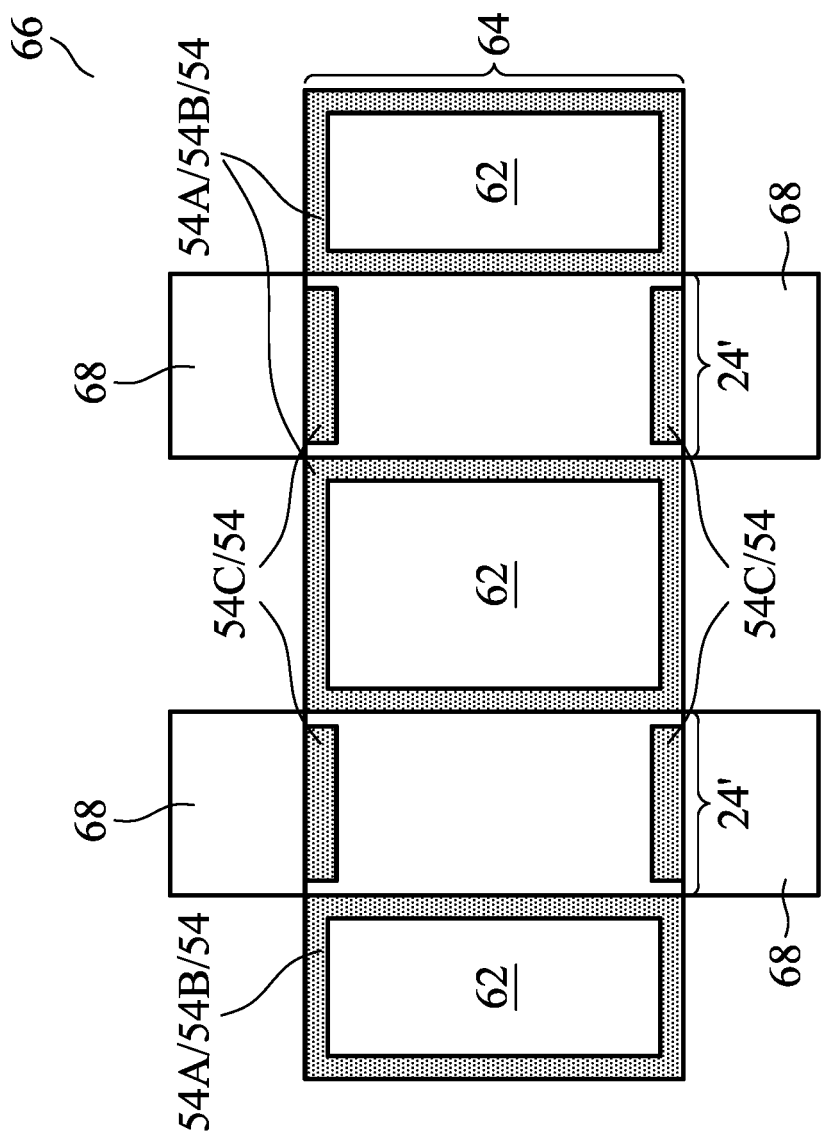
FIG. 16 illustrates a top view of a portion of a FinFET in accordance with some embodiments.

FIG. 16 illustrates a top view of FinFET 66, wherein replacement gate 64 and protruding fins 24' are illustrated, while other components of FinFET 66 are not shown. The locations in which polysilicon corner spacers 54 are likely to form are illustrated and marked as 54. Polysilicon corner spacers 54A and 54B may form full rings, partial rings, or isolated portions aligned to the illustrated rings.

FIG. 16 also illustrates polysilicon corner spacers 54C, which are formed on the top of protruding fins 24'. Polysilicon corner spacers 54C are also at the corners formed between horizontal portions and vertical portions of diffusion barrier layer 52 (FIG. 15A), except that the respective horizontal portions of diffusion barrier layer 52 are on top of protruding fins 24'. Also, polysilicon corner spacers 54C may be physically disconnected from polysilicon corner spacers 54A and 54B.

It is appreciated that the formation of polysilicon corner spacers 54 are affected by various process conditions, and the actual locations and sizes of polysilicon corner spacers 54 are affected by process variations. Accordingly, polysilicon corner spacers 54 are very likely, but not necessarily, appear in all or some part of the marked corner regions. Accordingly, on an actual wafer, polysilicon corner spacers 54 may form (or not form) in all or any part of the locations as illustrated in FIG. 16, and may be formed as disconnected spacers.

The embodiments of the present disclosure have some advantageous features. By using the dry etch to remove the sacrificial polysilicon that is used for annealing diffusion barrier layer and the high-k dielectric layer, the undesirable removal of the corner portions of the diffusion barrier layer and the high-k dielectric layer is avoided. As a result, the metal gate extrusion formed due to the undesirable removal of the corner portions of the diffusion barrier layer and the high-k dielectric layer is avoided.

In accordance with some embodiments of the present disclosure, method includes forming an opening in a dielectric to reveal a protruding semiconductor fin, forming a gate dielectric on sidewalls and a top surface of the protruding semiconductor fin, and forming a conductive diffusion barrier layer over the gate dielectric. The conductive diffusion barrier layer extends into the opening. The method further includes forming a silicon layer over the conductive diffusion barrier layer and extending into the opening, and performing a dry etch on the silicon layer to remove horizontal portions and vertical portions of the silicon layer. After the dry etch, a conductive layer is formed over the conductive diffusion barrier layer and extending into the opening.

In accordance with alternative embodiments of the present disclosure, a method includes removing a dummy gate stack to form an opening in an inter-layer dielectric, forming a gate dielectric on sidewalls and a top surface of a protruding semiconductor fin in the opening, and forming a conductive diffusion barrier layer over the gate dielectric. The conductive diffusion barrier layer extends into the opening. The method further includes forming a polysilicon layer over the conductive diffusion barrier layer and extending into the opening, and performing an anneal on the polysilicon layer and the gate dielectric. After the anneal, an anisotropic etch is performed on the polysilicon layer to form a polysilicon corner spacer at a corner of the opening, wherein a polymer is formed to cover the polysilicon corner spacer. The polymer is then etched, with the polysilicon corner spacer remaining after the etching. After the anisotropic etch, a conductive layer is formed over the conductive diffusion barrier layer and the polysilicon corner spacer.

In accordance with yet alternative embodiments of the present disclosure, a device includes an isolation region, a protruding semiconductor fin over top surfaces of the isolation region, and a gate stack on a top surface and sidewalls of the protruding semiconductor fin. The gate stack includes a gate dielectric, a conductive diffusion barrier layer over the gate dielectric, a silicon corner spacer over the conductive diffusion barrier layer, wherein the silicon corner spacer is at a bottom corner of the conductive diffusion barrier layer, and a conductive layer over and contacting the silicon corner spacer, wherein the conductive diffusion barrier layer, the silicon corner spacer, and the conductive layer form a portion of a gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
an isolation region;
a first protruding semiconductor fin and a second protruding semiconductor fin higher than a top surface of the isolation region, wherein the first and the second protruding semiconductor fins are immediately neighboring each other, with no other protruding semiconductor fin therebetween; and
a gate stack extending onto a top surface and sidewalls of the first protruding semiconductor fin and the second protruding semiconductor fin, wherein the gate stack comprises:
a gate dielectric;
a conductive diffusion barrier layer over the gate dielectric, wherein the conductive diffusion barrier layer comprises a metal nitride;
a first silicon corner spacer and a second silicon corner spacer over the conductive diffusion barrier layer, wherein both of the first and the second silicon corner spacers are between the first and the second protruding semiconductor fins, and are at bottom corners of the conductive diffusion barrier layer; and
a conductive layer over the first and the second silicon corner spacers, wherein the conductive diffusion barrier layer and the conductive layer enclose the first silicon corner spacer and the second silicon corner spacer therein, and physically separate the first silicon corner spacer from the second silicon corner spacer in a cross-sectional view of the device, and wherein the conductive diffusion barrier layer, the first and the second silicon corner spacers, and the conductive layer form a portion of a gate electrode of a Fin Field-Effect Transistor (FinFET).

2. The device of claim 1, wherein the conductive layer comprises an additional metal nitride, with the conductive diffusion barrier layer and the conductive layer in contact with each other.

3. The device of claim 1 further comprising an inter-layer dielectric on opposite sides of the gate electrode.

4. The device of claim 1, wherein the first silicon corner spacer is undoped with p-type and n-type impurities.

5. The device of claim 1, wherein the conductive diffusion barrier layer comprises a first portion in physical contact with a first portion of the conductive layer.

6. The device of claim 5, wherein the first portion of the conductive diffusion barrier layer and the first portion of the conductive layer are horizontal portions, and wherein the conductive diffusion barrier layer further comprises a second portion in physical contact with a second portion of the conductive layer, with the second portion of the conductive diffusion barrier layer and the second portion of the conductive layer being vertical portions.

7. A device comprising:
a transistor comprising:
a gate dielectric;
a first conductive layer over the gate dielectric;
a first silicon layer and a second silicon layer over the first conductive layer; and
a second conductive layer over the first silicon layer and the second silicon layer, wherein the second conductive layer comprises a lower surface comprising:
a first portion and a second portion in contact with the first silicon layer and the second silicon layer, respectively; and
a third portion in direct contact with the first conductive layer in a region between the first silicon layer and the second silicon layer, wherein in a cross-sectional view of the device, the first silicon layer and the second silicon layer are physically separated from each other by the first conductive layer and the third portion of the second conductive layer.

8. The device of claim 7, wherein the first portion is a substantially vertical portion, and the second portion is a substantially horizontal portion.

9. The device of claim 7, wherein the third portion of the lower surface of the second conductive layer is between, and interconnects, the first portion and the second portion of the lower surface of the second conductive layer.

10. The device of claim 7 further comprising:
an isolation region comprising two portions;
a semiconductor strip between the two portions of the isolation region; and
a protruding semiconductor fin over and contacting the semiconductor strip, wherein the first silicon layer is at a corner formed between the protruding semiconductor fin and a top surface of one of the two portions of the isolation region.

11. The device of claim 7, wherein the first conductive layer comprises a metal nitride layer having a top surface in contact with the first silicon layer and the second silicon layer.

12. The device of claim 7, wherein, wherein the first conductive layer and the second conductive layer in combination fully enclose the first silicon layer and the second silicon layer therein.

13. The device of claim 7, wherein the first silicon layer and the second silicon layer are undoped with p-type and n-type impurities.

14. The device of claim 7, wherein the first silicon layer and the second silicon layer comprise polysilicon.

15. The device of claim 7, wherein the first silicon layer and the second silicon layer comprise amorphous silicon.

16. A device comprising:
an isolation region;
a first protruding semiconductor fin higher than a top surface of the isolation region;

a second protruding semiconductor fin higher than the top surface of the isolation region, wherein the isolation region is between the first protruding semiconductor fin and the second protruding semiconductor fin;

a gate stack extending onto a top surface and sidewalls of the first protruding semiconductor fin, wherein the gate stack comprises:

a gate dielectric;

a first conductive layer over the gate dielectric;

a first silicon corner spacer over a bottom portion of the first conductive layer;

a second silicon corner spacer over the bottom portion of the first conductive layer, wherein both the first silicon corner spacer and the second silicon corner spacer overlap the isolation region, and the first silicon corner spacer is physically separated from the second silicon corner spacer; and a second conductive layer over the first silicon corner spacer, wherein the first conductive layer and the second conductive layer enclose the first silicon corner spacer and the second silicon corner spacer therein; and source and drain regions on opposite sides of the gate stack.

17. The device of claim 16, wherein each of the first conductive layer and the second conductive layer is free from silicon, and comprises a metal nitride.

18. The device of claim 17, wherein the metal nitride in the first conductive layer and the metal nitride in the second conductive layer are both in contact with the first silicon corner spacer.

19. The device of claim 16, wherein the first silicon corner spacer and the second silicon corner spacer are separated from each other by the second conductive layer.

20. The device of claim 1, wherein the conductive diffusion barrier layer and the conductive layer are in physical contact with each other in a region between the first silicon corner spacer and the second silicon corner spacer.

* * * * *